(12) United States Patent
Zang et al.

(10) Patent No.: US 10,475,791 B1
(45) Date of Patent: Nov. 12, 2019

(54) TRANSISTOR FINS WITH DIFFERENT THICKNESS GATE DIELECTRIC

(71) Applicant: GLOBALFOUNDRIES INC., Grand Cayman (KY)

(72) Inventors: Hui Zang, Guilderland, NY (US); Garo Jacques Derderian, Saratoga Springs, NY (US); Laertis Economikos, Wappingers Falls, NY (US); Chun Yu Wong, Ballston Lake, NY (US); Jiehui Shu, Clifton Park, NY (US); Shesh Mani Pandey, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/994,231

(22) Filed: May 31, 2018

(51) Int. Cl.
*H01L 27/088* (2006.01)
*H01L 29/66* (2006.01)
*H01L 21/8234* (2006.01)

(52) U.S. Cl.
CPC .. *H01L 27/0886* (2013.01); *H01L 21/823431* (2013.01); *H01L 29/66545* (2013.01); *H01L 29/66818* (2013.01)

(58) Field of Classification Search
CPC ............... H01L 29/165; H01L 29/7848; H01L 29/66545; H01L 27/0886; H01L 21/823431
See application file for complete search history.

(56) References Cited

U.S. PATENT DOCUMENTS

| | | | |
|---|---|---|---|
| 7,301,210 B2 | 11/2007 | Abadeer et al. | |
| 7,378,357 B2 | 5/2008 | Clark, Jr. et al. | |
| 7,687,339 B1 | 3/2010 | Schultz et al. | |
| 7,763,531 B2 | 7/2010 | Abadeer et al. | |
| 7,960,287 B2 | 6/2011 | Johnson et al. | |
| 8,557,675 B2 | 10/2013 | LiCausi | |
| 8,722,494 B1 | 5/2014 | Basker et al. | |
| 9,576,954 B1 | 2/2017 | Greene et al. | |
| 9,691,664 B1 | 6/2017 | Sung et al. | |
| 2014/0001562 A1* | 1/2014 | Liaw | H01L 21/823431 257/369 |
| 2016/0284700 A1* | 9/2016 | Yoon | H01L 27/0886 |
| 2017/0140997 A1* | 5/2017 | Pae | H01L 21/823807 |
| 2018/0247938 A1* | 8/2018 | Cheng | H01L 27/0924 |
| 2018/0286982 A1* | 10/2018 | Krishnan | H01L 29/41791 |

* cited by examiner

*Primary Examiner* — Julio J Maldonado
*Assistant Examiner* — John M Parker
(74) *Attorney, Agent, or Firm* — Gibb & Riley, LLC; Francois Pagette (57) ABSTRACT

First and second fin-type field effect transistors (finFETs) are formed laterally adjacent one another extending from a top surface of an isolation layer. The first finFET has a first fin structure and the second finFET has a second fin structure. An insulator layer is on the first fin structure and the second fin structure. A gate conductor intersects the first fin structure and the second fin structure, and at least the insulator layer separates the gate conductor from the first fin structure and the second fin structure. Source and drain structures are on the first fin structure and the second fin structure laterally adjacent the gate conductor. The first fin structure has sidewalls that include a step and the second fin structure has sidewalls that do not include the step. The step is approximately parallel to the surface of the isolation layer.

13 Claims, 10 Drawing Sheets

TRANSISTOR FINS WITH DIFFERENT THICKNESS GATE DIELECTRIC

BACKGROUND

Field of the Invention

The present disclosure relates to fin-type field effect transistors (FINFETs), and more specifically, to fins having different thickness gate dielectrics.

Description of Related Art

Integrated circuit devices use transistors for many different functions, and these transistors can take many different forms, from planar transistors, to transistors that use a "fin" style structure. With constant reductions in size (scaling) of integrated circuit devices, the fin-type field effect transistors (FINFETs) are finding many uses in integrated circuit technologies. A fin of a fin-type transistor is a thin, long, six-sided shape (that is somewhat rectangular) that extends from, or has a bottom surface that is part of, a substrate; with sides that are longer than they are wide, a top and bottom that have somewhat similar lengths as the sides (but that have widths that are much narrower) and ends that are approximately as tall from the substrate as the width of the sides, but that are only approximately as wide as the top and/or bottom. Rounding and uneven shaping can occur (especially at the corners and top) in such fin structures, and often such structures have a rounded, tapered shape; however, such structures are highly distinguishable from planar devices (even though both types of devices are highly useful).

Some structures form complementary (opposite polarity) transistors or groups of complementary transistors adjacent one another. One example of such structures is complementary metal oxide semiconductor (CMOS) structures. Other processing may form differently sized transistors, or differently functioning transistors on the same substrate in parallel processing. The transistors within such structures often have different electrical characteristics and therefore can include different doping, different insulators, etc. It is useful to reduce the number of processes when simultaneously forming such different transistors to make the manufacturing process as efficient as possible.

SUMMARY

Exemplary methods herein pattern a substrate to form at least two laterally adjacent fins extending from the substrate. Such methods form an isolation layer on the substrate to partially cover the fins, and form a sacrificial gate intersecting the fins. Source and drain structures are also formed on the fins laterally adjacent the sacrificial gate.

Such methods remove a portion of the sacrificial gate to expose one or more first fins of the previously patterned fins. Then, the first fins are oxidized to form a first oxide on the first fins and to thin (reduce the width of) the first fins. Also, the oxidizing of the first fins causes a first distance between adjacent ones of the first fins to be greater than a second distance between adjacent ones of the second fins.

The first oxide is removed from the first fins, and a first insulator layer is formed on the first fins. Following this, the remainder of the sacrificial gate is removed to expose one or more second fins of the previously patterned fins. Then, such methods form a second insulator layer on the first insulator layer and the second fins. The second insulator layer (e.g., high-k material) is different from the first insulator layer (e.g., oxide). Subsequently, a work function metal is deposited over the second insulator layer. Then, a gate conductor is formed over the work function metal layer and the second insulator layer in a location where the sacrificial gate was positioned.

Exemplary integrated circuit devices herein include (among other components) an isolation layer on a substrate, where the isolation layer has a top planar surface opposite where the isolation layer contacts the substrate. Also, the isolation layer has a first area separated from a second area by an isolation recess. First fin-type field effect transistors (finFETs) are formed in the first area of the isolation layer and second (opposite polarity) finFETs are formed in the second area of the isolation layer. The first finFETs have first fin structures extending from the substrate through the isolation layer and extending external to the isolation layer. The second finFETs have second fin structures extending from the substrate through the isolation layer and extending external to the isolation layer.

An insulator layer is on the first fin structures and the second fin structures, and a gate conductor intersects the first fin structures and the second fin structures. At least the insulator layer separates the gate conductor from the first fin structures and the second fin structures. Additionally, a work function metal layer is between the gate conductor and the insulator layer. Further, source and drain structures are on the first fin structures and the second fin structures, laterally adjacent the gate conductor. The first fin structures have sidewalls that include a step at the location where the first fin structures intersect the surface of the isolation layer, but the second fin structures have sidewalls that do not include such a step. The step is a portion of the fin sidewall that is approximately parallel to the top planar surface of the isolation layer.

Additionally, the portion of the first fin that extends from the isolation layer is thinner relative to the portion of the second fin that extends from the isolation layer. Correspondingly, the distance between adjacent ones of the first fin structures is greater than a second distance between adjacent ones of the second fin structures.

Also, the insulator layer is made up of two portions, a first portion on the first fin structures and a second portion on the second fin structures. In greater detail, the first portion of the insulator layer comprises at least two layers of different insulating materials, while the second portion of the insulator layer comprises relatively less layers of insulating materials (relative to the first portion of the insulator layer). For example, the first portion of the insulator layer can be made of two different insulator layers (e.g., an oxide and a high-k material), but the second portion of the insulator layer is only made of one insulator layer (e.g., only a high-k material layer). Therefore, the first portion of the insulator layer is thicker than the second portion of the insulator layer. However, because the portion of the first fin that extends from the isolation layer is thinner relative to the portion of the second fin that extends from the isolation layer, the additional thickness of the first portion of the insulator layer does not result in inter-fin spacing problems with the work function metal layer.

BRIEF DESCRIPTION OF THE DRAWINGS

The embodiments herein will be better understood from the following detailed description with reference to the drawings, which are not necessarily drawn to scale and in which:

FIGS. 7B-17 are cross-section conceptual schematic diagrams illustrating partially formed integrated circuit devices according to embodiments herein;

FIGS. 18B-21 are cross-section conceptual schematic diagrams illustrating partially formed integrated circuit devices according to embodiments herein.

DETAILED DESCRIPTION

As noted above, transistors within larger integrated circuit structures often are designed to have different electrical characteristics and therefore can include different doping, different insulators, differently sized channel regions, etc. In one example, transistors used for input/output (I/O) operations may need thick insulators for durability; however simultaneously formed core transistors may operate better with thinner insulators that allow devices to be spaced closer and to operate faster.

Thus, sometimes different insulators are desired for different types of transistors to allow the transistors to function differently and achieve specific device performance goals; however, use of thicker insulators can cause the spaces between fins of fin-type transistors to be too small for effective device manufacture. As a compromise, a middle ground thickness insulator is often selected that is not optimal for either type of transistor, but that does allow both types of transistors to be simultaneously manufactured. Alternatively, different thickness insulators can be formed if additional, somewhat redundant, distinct manufacturing processes area added.

In one specific example, gaps between surfaces of work function metals preliminarily formed on fins can be very small, or in some instances there may be no gap if the insulator is too thick, the fins are too wide, the inter-fin spacing is too small, etc. A gate conductor and work function metal are sometimes designed to be used in combination, and if only the work function metal is present, without the gate conductor (e.g., where there is a missing gap between fins) the electrical field effects of the gate conductor on the transistor's fin channel region may detrimentally affect operations of the transistor. In view of this, the processing described below produces a uniform thickness work function metal layer that provides sufficient gaps between the fins even when different thickness insulators and/or different width fins are used, to consistently allows gate conductors to reach into the gaps between adjacent fin shaped channel regions.

Figure 21:
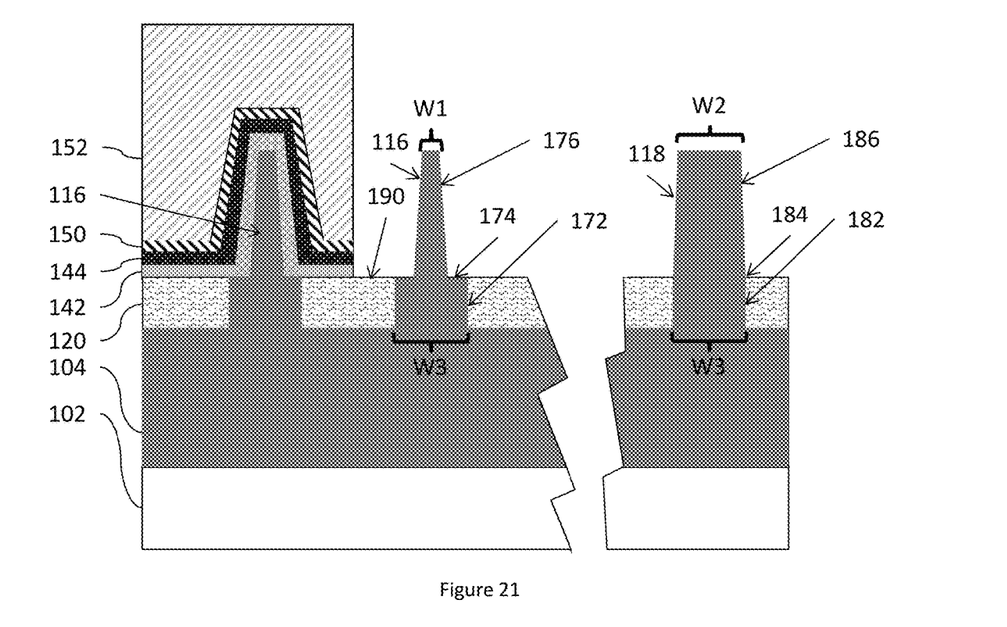
Figure 22:
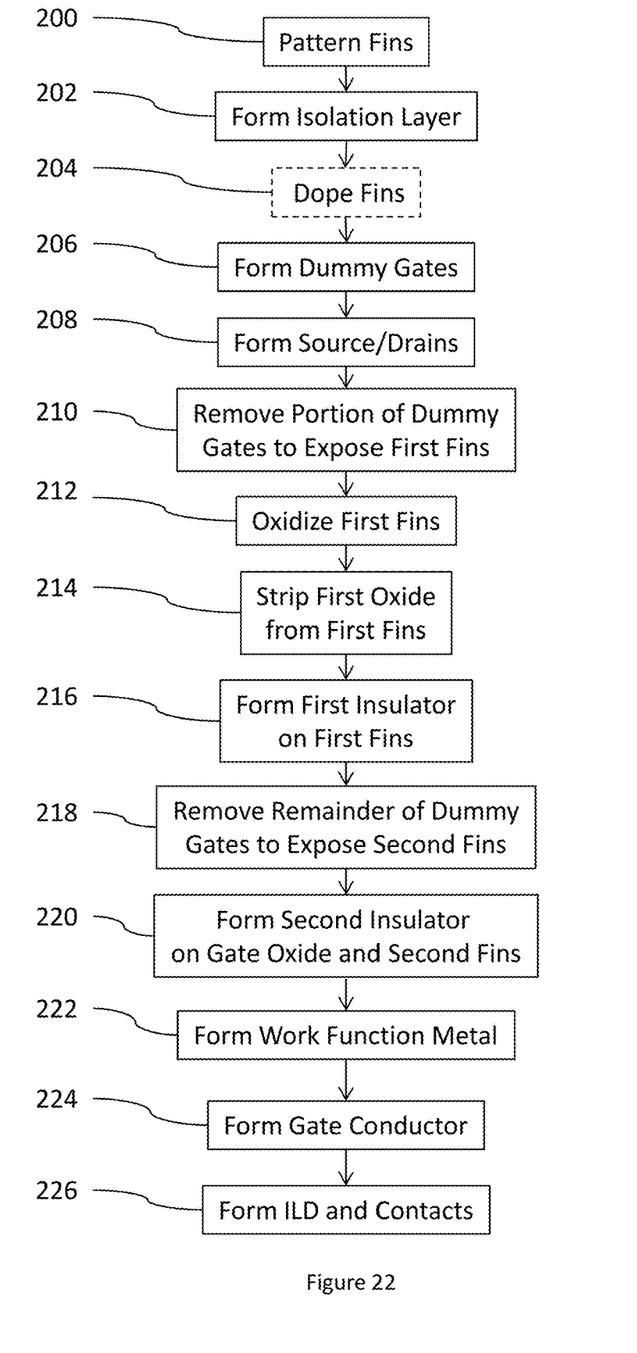
FIG. 22 is a flow diagram illustrating embodiments herein.

FIG. 22 is a flowchart of one possible processing flow herein, and FIGS. 1-21 show conceptual views of structures formed by such processing, although those ordinarily skilled in the art would understand that other variations of the same processing are considered illustrated by such a flowchart and structural drawings.

More specifically, as shown in cross-section in FIG. 1-4, and as shown in item 200 in FIG. 22, exemplary methods herein pattern a substrate 104 to form at least two laterally adjacent fins 112 extending from a substrate 104. The fins 112 can be patterned using many different methods, such as patterning using sidewall spacer masks.

Figure 1:
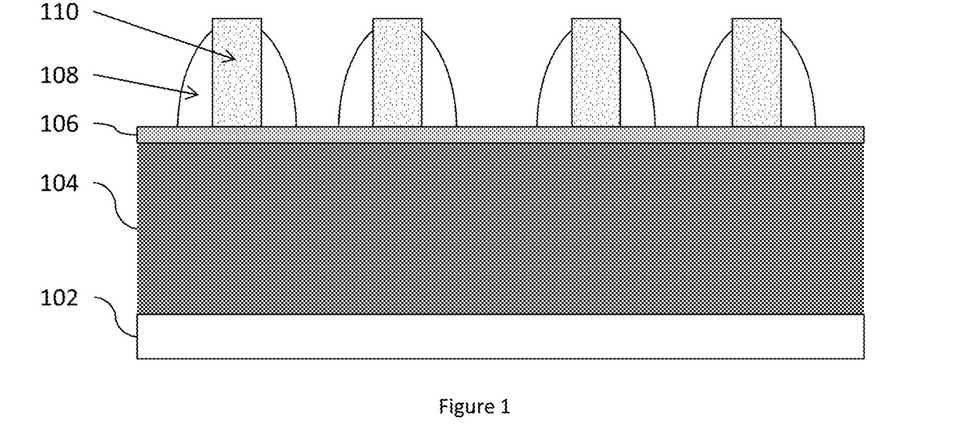
FIGS. 1-6 are cross-section conceptual schematic diagrams illustrating partially formed integrated circuit devices according to embodiments herein.

More specifically, as shown in FIG. 1, a silicon layer 104 (which may be in situ doped or undoped at this point in processing and is sometimes referred to as a substrate) is deposited on an underlying layer 102 (such as a wafer or buried oxide layer). Also, a protective cap layer 106 can be formed (deposited or grown) on the silicon layer 104.

Mandrels 110 are patterned on the protective cap layer 106. In patterning processes herein material to be patterned, such as the silicon layer 104 and the protective cap layer 106, can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then, one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off)). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

Therefore, as shown in FIG. 1, mandrels 110 of a sacrificial material can be patterned using a resist and etching, and sidewall spacers 108 can be grown on the mandrels 110. For purposes herein, "sidewall spacers" are structures that are generally formed by depositing or growing a conformal layer, and then performing a directional (anisotropic) etching process that etches material from horizontal surfaces at a greater rate than it removes material from vertical surfaces, thereby leaving insulating material along the vertical sidewalls of structures. This material left on the vertical sidewalls is referred to as sidewall spacers.

Figure 2:
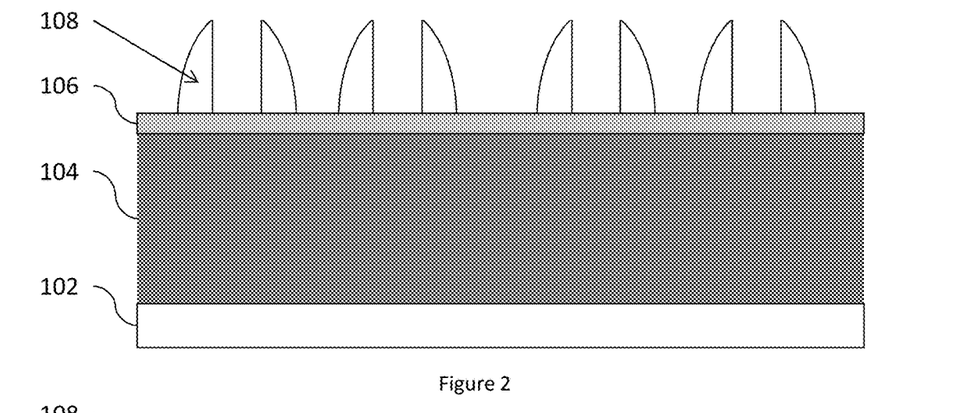
Figure 3:
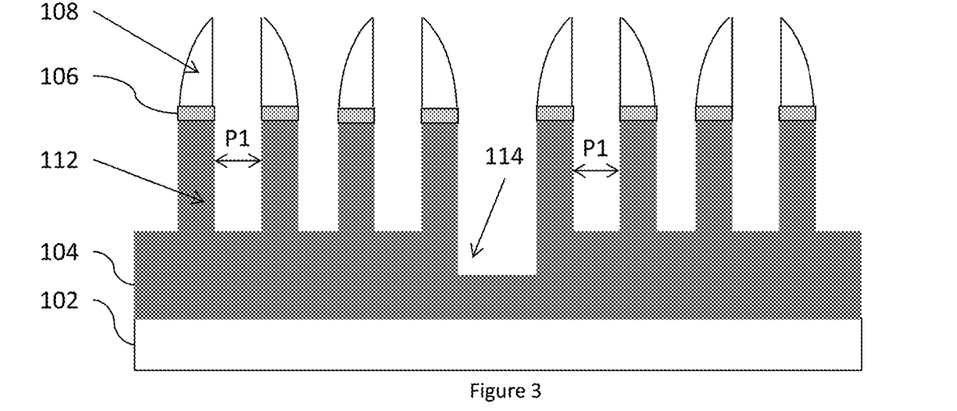
Figure 4:
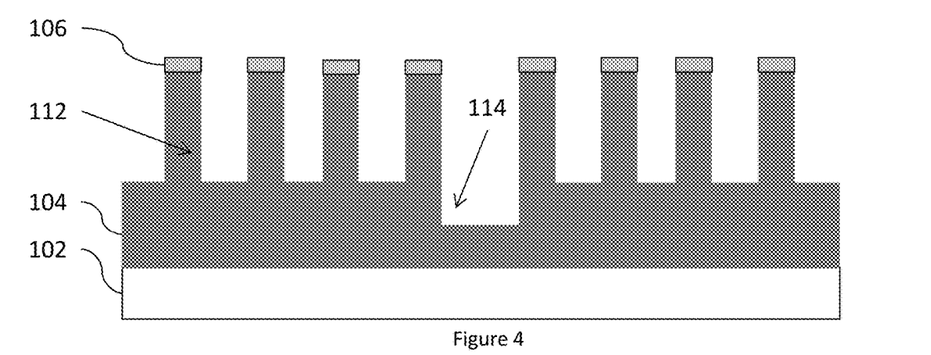

As shown in FIG. 2, the mandrels 110 are removed in a selective removal process (e.g., wet processing) that allows the protective cap layer 106 and sidewall spacers 108 to remain. In FIG. 3, a material removal process is then used to transfer the pattern of the sidewall spacers 108 through the protective cap layer 106 and partially through the silicon layer 104 (to leave fins 112 of silicon extending from the substrate 104 of silicon). This forms fins 112 that are of uniform size (uniform length, width, and height) and that are at the same pitch (P1) and spacing (even though groups of fins of equal pitch and spacing may be separated from one another) as shown in FIG. 3. Also, as shown in FIG. 3, more material removal processing (and/or the spacing between mandrels 110) allows an isolation region or recess 114 to be formed in the silicon layer 104. Such processing is controlled (time control, power control, etc.) to limit the amount of silicon layer 104 removed, and to not etch completely through the silicon material 104. The sidewall spacers 108 are removed in a selective removal process (e.g., wet processing) that allows the protective cap layer 106 and fins 112 to remain, as shown in FIG. 4.

Figure 5:
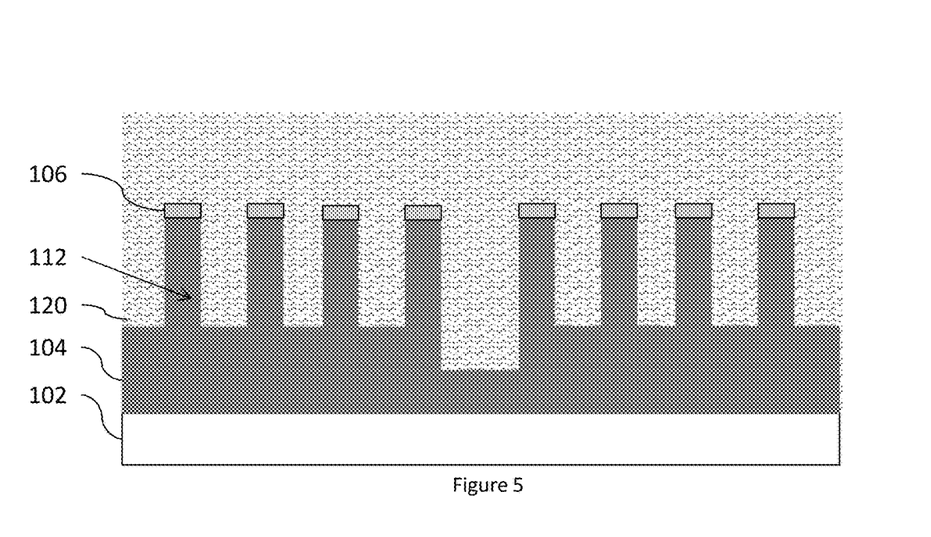
Figure 6:
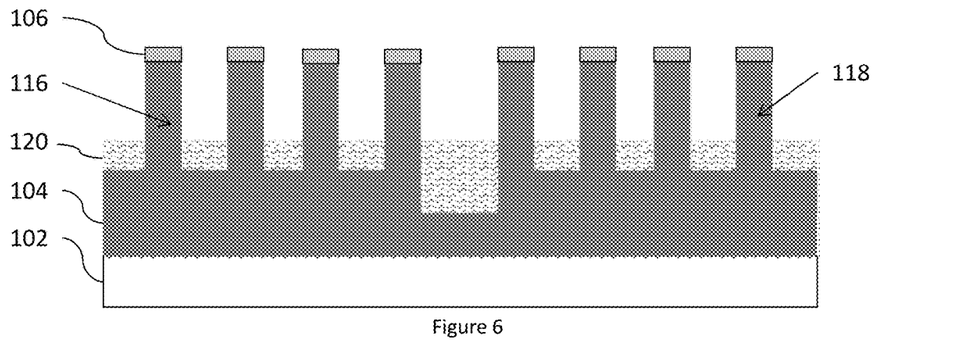

As shown in FIGS. 5 and 6, and in item 202 in FIG. 22, such methods form an isolation layer 120 on the substrate 104 to partially cover the fins 112. More specifically, an isolation material (e.g., low-k material) 120 is deposited over the fins, as shown in FIG. 5. Then, a fin reveal process is performed in which the isolation material 120 is removed in a selective removal process (that does not affect the protective cap layer 106 or fins 112) to reduce the height of the isolation material 120 above the silicon layer 104 to allow a portion of the fins 112 to extend from the isolation material 120. Such processing is controlled (time control, power control, etc.) to limit the amount of isolation material 120 removed, and not completely remove the isolation material 120.

As shown in item 204 in FIG. 22, such methods can dope the exposed portions of the fins 112 with impurities to form similarly or differently doped fins (first fins 116 and second fins 118, as shown in FIG. 6). For example, one group of fins could be heavily doped, while another group could be more lightly doped, or another group could be oppositely doped, etc. During such doping, some fins may be protected with a mask while other fins are doped. Also, those ordinarily skilled in the art would understand the fins 112 could be doped at many different points in the processing, and this processing sequence arbitrarily shows doping occurring at this point.

In one example different groups of fins could be doped with opposite impurities so as to form groups of complementary transistors adjacent one another. For example, a positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region. Again, these are only examples, and different dopants could be used for different types of transistors.

Figure 7A:
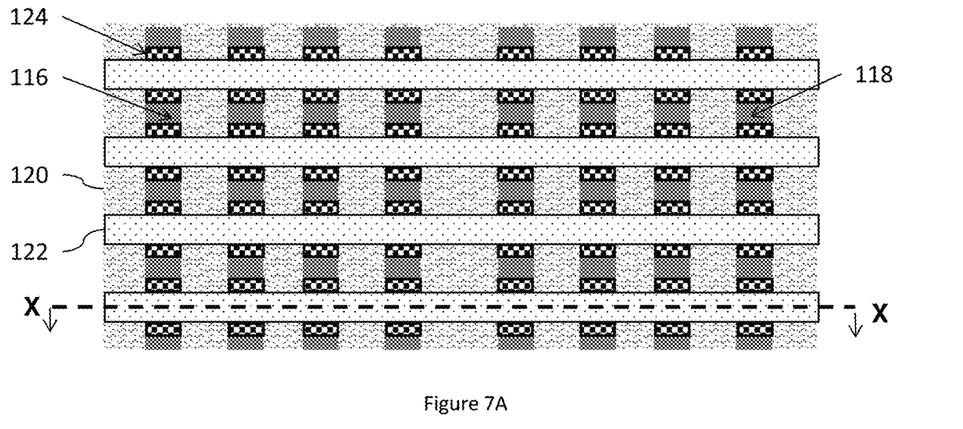
FIG. 7A is a top (plan) view conceptual schematic diagram illustrating partially formed integrated circuit devices according to embodiments herein.
Figure 7B:
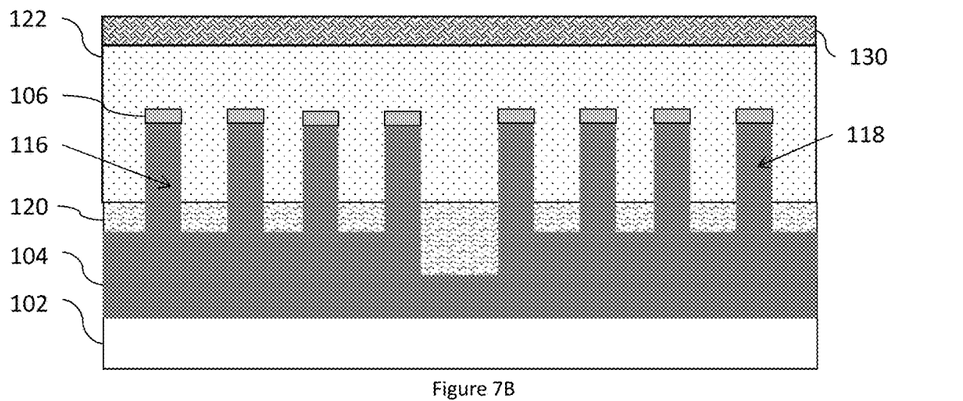

FIGS. 7A and 7B, and item 206 in FIG. 22, illustrate that such methods form sacrificial (dummy) gates 122 intersecting the fins 116/118; and as shown in item 208 in FIG. 22, such methods form source and drain structures 124 on the fins 116, 118 laterally adjacent the sacrificial gate 122. More specifically, FIG. 7A is a top (plan) conceptual schematic view, and all cross-sectional views (FIGS. 1-6, 7B-17, and 18B-21) are cross-sections of line X-X shown in FIG. 7A (and shown in FIG. 18A). FIG. 7A illustrates how the dummy gates 122 (e.g., polysilicon), potentially with an overlying protective nitride cap 130 are patterned into elongated parallel structures (having lengths longer than their widths) that are approximately (e.g., within 5%, 10%, 25%) perpendicular to the similarly elongated groups of parallel fins 116, 118. FIG. 7B is a cross-sectional view of the same structure along line X-X in FIG. 7A. With the dummy gates 122 in place, and potentially other structures, the source/drain regions 124 are formed (e.g., epitaxially grown) on/from the fins 116, 118 using impurities that operate with the doping of the fins 116, 118 (e.g., to form NPN or PNP junctions).

Figure 8:
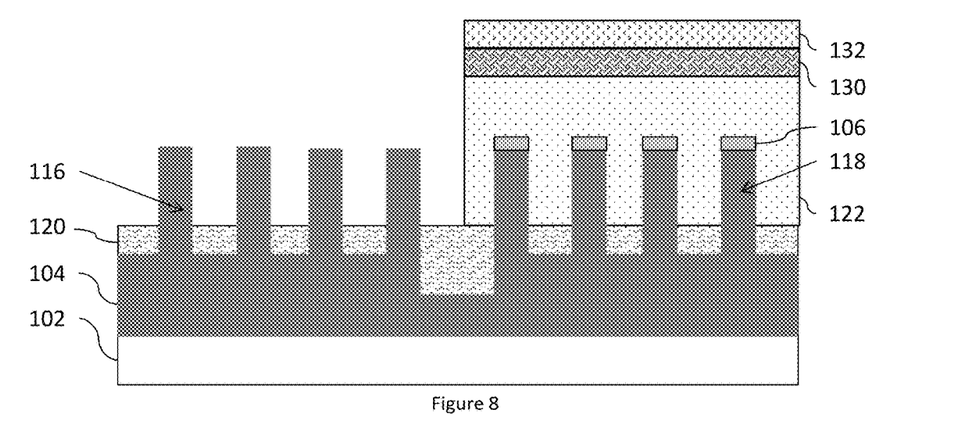

As shown in FIG. 8, and in item 210 in FIG. 22, such methods remove a portion of the dummy gates 122 to expose the first fins 116. For example, a patterned mask 132 can be patterned to protect the second fins 118, and then a selective material removal process is applied to remove the portion of the dummy gates 122 that are over the first fins 116, but leave the portion of the dummy gates 122 (and protective cap 130) over the second fins 118.

Figure 9:
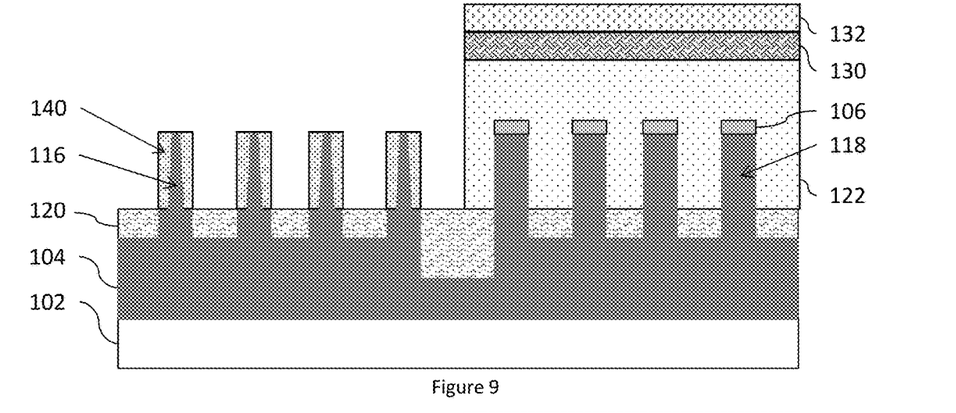
Figure 10:
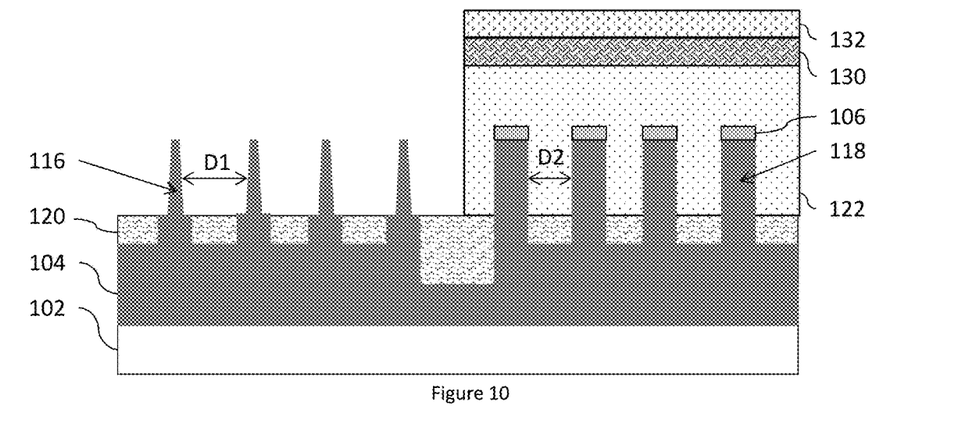

Then, in item 212 in FIG. 22, and as shown in FIG. 9, the first fins 116 are oxidized to form a first oxide 140 on the first fins 116. Such an oxidization process consumes some of the material of the first fins 116 to thin (reduce the width of) the first fins 116. Following this, in item 214 in FIG. 22, and as shown in FIG. 10, the first oxide 140 is removed or stripped from the first fins 116, using any appropriate material removal process for oxides. The oxidizing of the first fins 116 in item 212 causes the distance (a "first" distance D1) between adjacent ones of the first fins 116 to be greater than the distance (a "second" distance D2) between adjacent ones of the second fins 118 that are not reduced in width. Reducing the width of the first fins 116 increases the distance between fins (from D2 to D1) and allows multiple insulator layers to be formed on the first fins later, while still leaving sufficient spacing for later formed structures such as work function metal layers and gate conductors.

Figure 11:
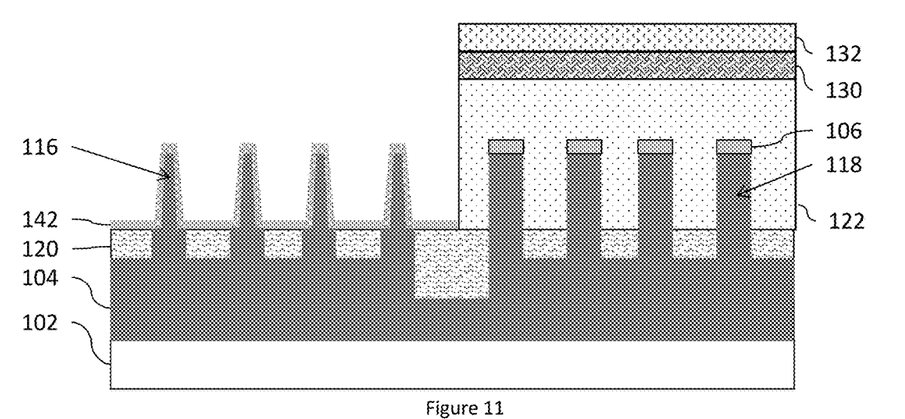

In item 216 in FIG. 22, and in FIG. 11, a first insulator layer 142 is formed only on the first fins 116. For example, the first insulator layer 142 can be silicon dioxide ($SiO_2$) or other similar oxide that can be deposited, flowed, grown, etc. The first insulator 142 does not form on the second fins 118 because the remaining portion of the dummy gates 122 prevents such.

Figure 12:
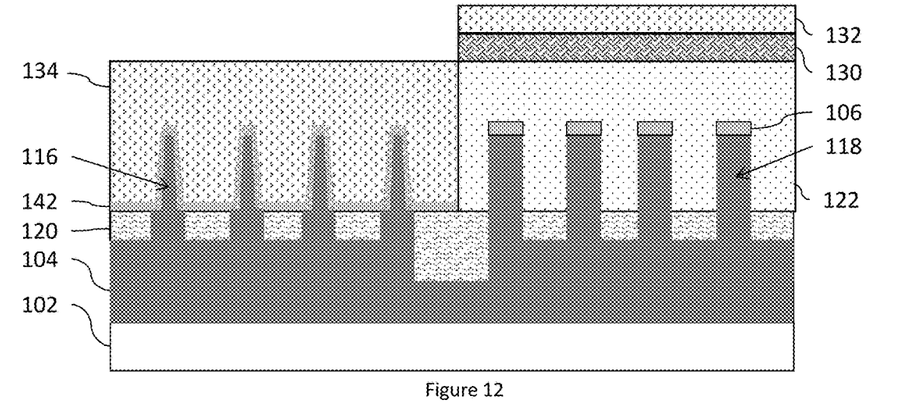
Figure 13:
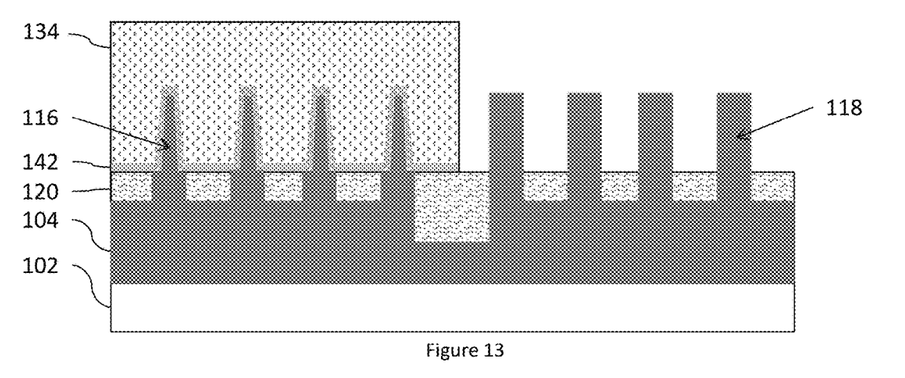
Figure 14:
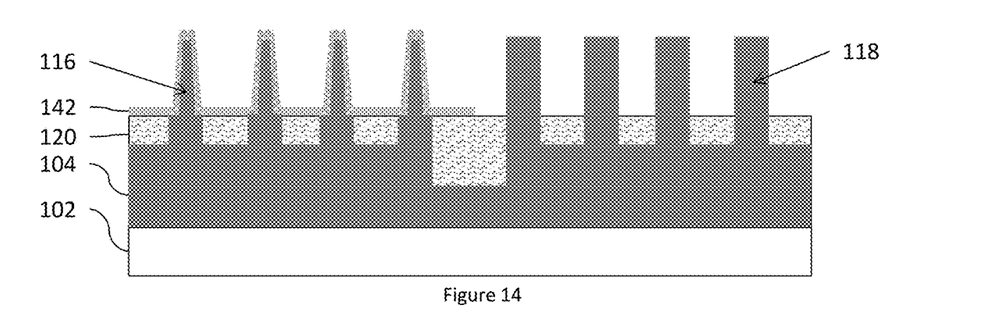

Following this, as shown in FIGS. 12 and 13, and in item 218 in FIG. 22, the remainder of the sacrificial gate 122 is removed to expose one or more second fins 118 of the previously patterned fins 116, 118. More specifically, a protective layer 134 is formed on the first insulator layer 142, and then selective material removal processing is used to remove all layers over the second fins 118 (e.g., remove the mask 132, the protective layer 130, and the remainder of the dummy gate 122). Then, as shown in FIG. 14 the protective layer 134 is removed (using a selective removal process).

Figure 15:
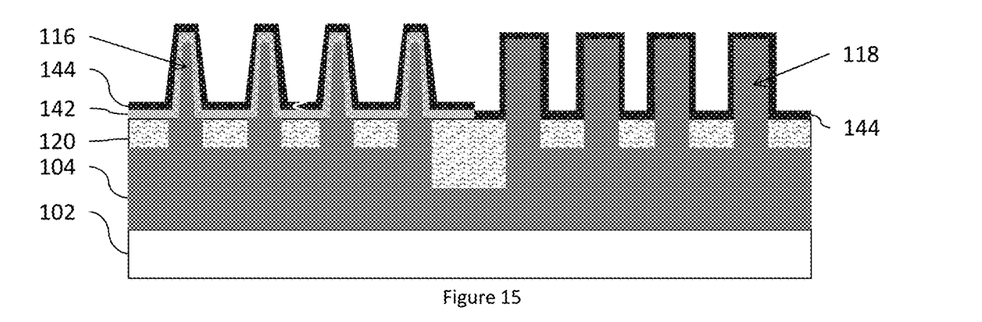

As shown in FIG. 15 and in item 220 in FIG. 22, such methods form a second insulator layer 144 on the first insulator layer 142 and the second fins 118. The second insulator layer 144 can be more of the same insulator material as the first insulator layer 142, or the second insulator layer 144 can be different from the first insulator layer 142 (e.g., a high-k material instead of an oxide). Therefore, such processing forms two insulator layers 142 and 144 over the first fins 116, but only forms a single insulator layer 144 over the second fins 118. Often, different insulators (meaning different thickness or different materials) are used for different types of transistors to allow the transistors to function differently and to achieve specific device performance goals; however, multiple insulators can cause the spaces between fins to be too small for effective formation of subsequent structures. The reduced thickness of the first fins 116 addresses these issues by providing more space between adjacent fins that will receive the thicker (double layer) insulator 142, 144.

Figure 16:
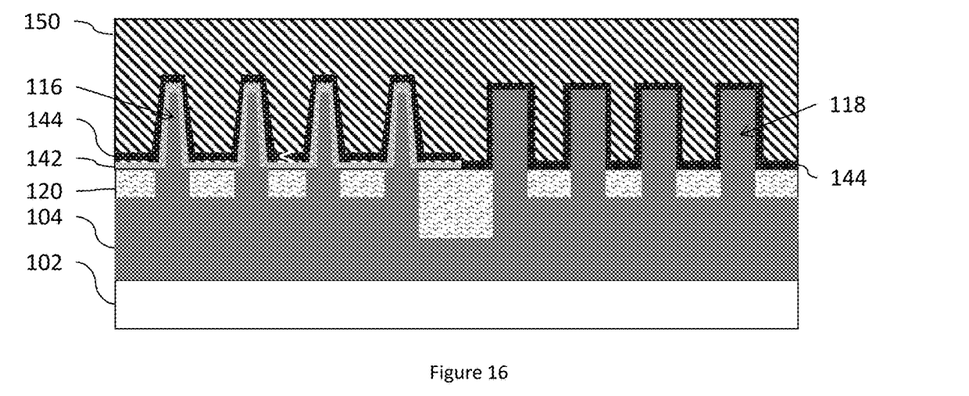
Figure 17:
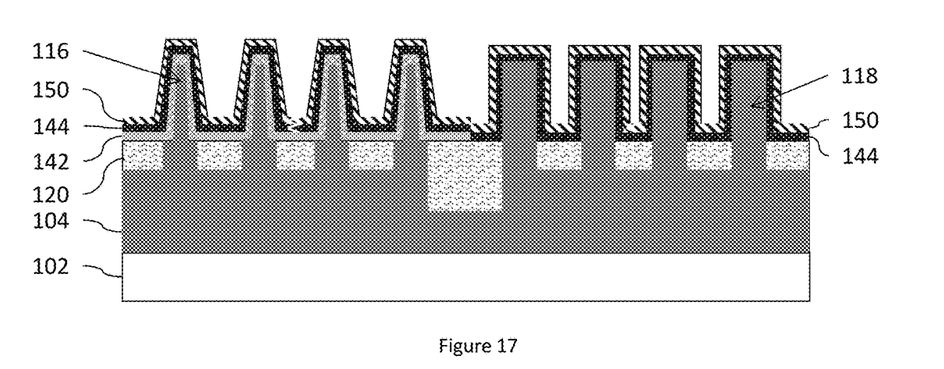
Figure 18A:
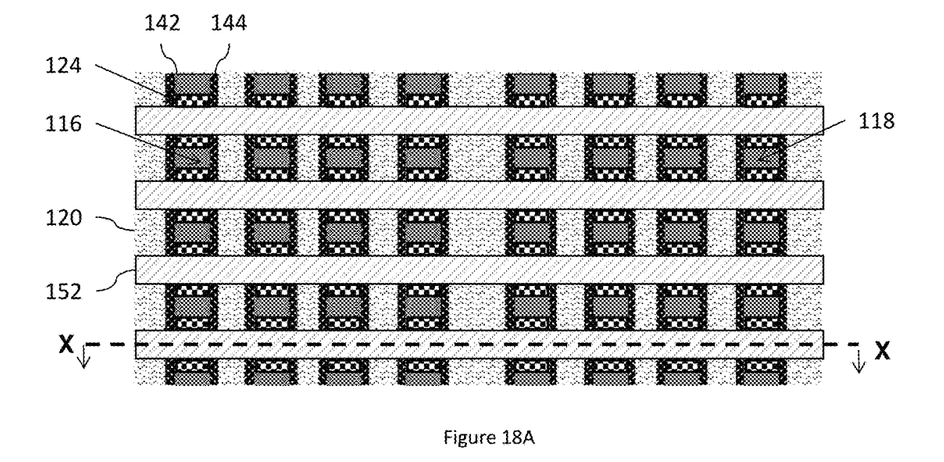
FIG. 18A is a top (plan) view conceptual schematic diagram illustrating partially formed integrated circuit devices according to embodiments herein.
Figure 18B:
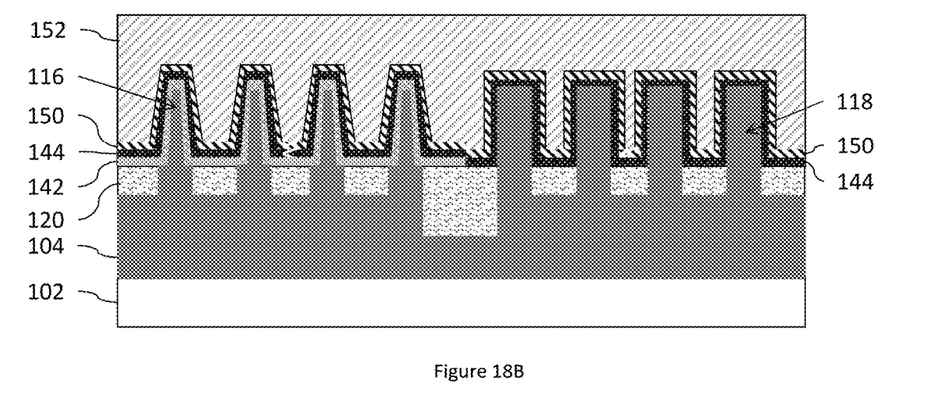

Subsequently, as shown in FIGS. 16 and 17, and in item 222 in FIG. 22, a work function metal 150 is deposited over the second insulator layer 144, and the work function metal is reduced in thickness (FIG. 17) using material removal processing, to leave a conformal layer of work function metal 150. In other alternatives, instead of thinning a thicker work function metal layer, a thin conformal work function metal 150 can be formed in a single process, as shown in FIG. 17. Then, as shown in FIGS. 18A and 18B and in item 224 in FIG. 22, a gate conductor 152 is formed and patterned over the work function metal layer 150 in a location where the sacrificial gate 122 was positioned. FIG. 18A is presented from the same view as FIG. 7A, discussed above. Also, in item 226 in FIG. 22, one or more inter-layer dielectric (ILD) layers are formed, and contacts are formed through the ILD to the gate conductor 152 and source/drain structures 124.

Therefore, FIGS. 18A and 18B illustrate exemplary integrated circuit devices herein that include (among other components) an isolation layer 120 (forming shallow trench isolation (STI) regions) on a substrate 104, where the isolation layer 120 has a top planar surface opposite where the isolation layer 120 contacts the substrate 104. Also, the isolation layer 120 has a first area separated from a second area by an isolation recess 114. First fin-type field effect transistors (finFETs) are formed in the first area of the isolation layer 120 and second finFETs (potentially having opposite polarity, different electrical characteristic, different size, etc., relative to the first finFETs) are formed in the second area of the isolation layer 120. The first finFETs have first fin structures 116 (semiconducting channel regions) extending from the substrate 104 through the isolation layer 120 and extending external to the isolation layer 120. The second finFETs have second fin structures 118 (semiconducting channel regions) extending from the substrate 104 through the isolation layer 120 and extending external to the isolation layer 120.

An insulator layer 142, 144 (gate insulator) is on the first fin structures 116 and the second fin structures 118, and a gate conductor 152 (gate structure) intersects the first fin structures 116 and the second fin structures 118. At least the insulator layer 142, 144 separates the gate conductor 152 from the first fin structures 116 and the second fin structures 118. Additionally, a work function metal layer 150 is between the gate conductor 152 and the insulator layer 142, 144. The work function metal 150 tunes the electrical field effects of the gate conductor 152 upon the channel regions 116, 118. Further, source and drain structures 124 are on the first fin structures 116 and the second fin structures 118, laterally adjacent the gate conductor 152.

Figure 19A:
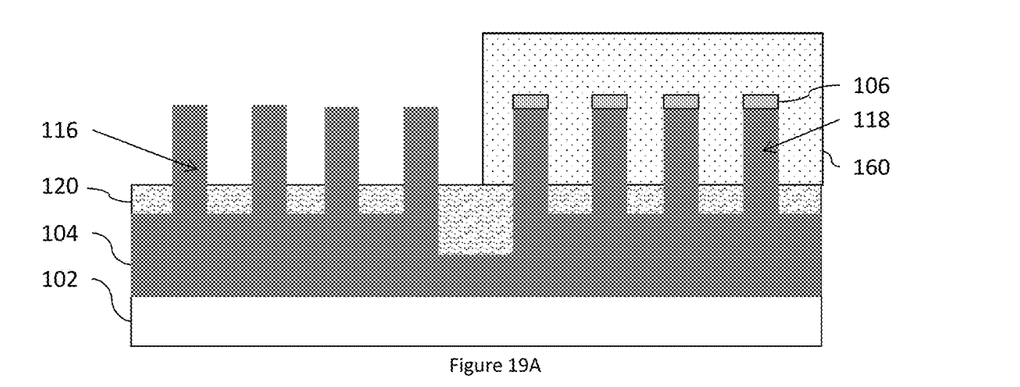
Figure 19B:
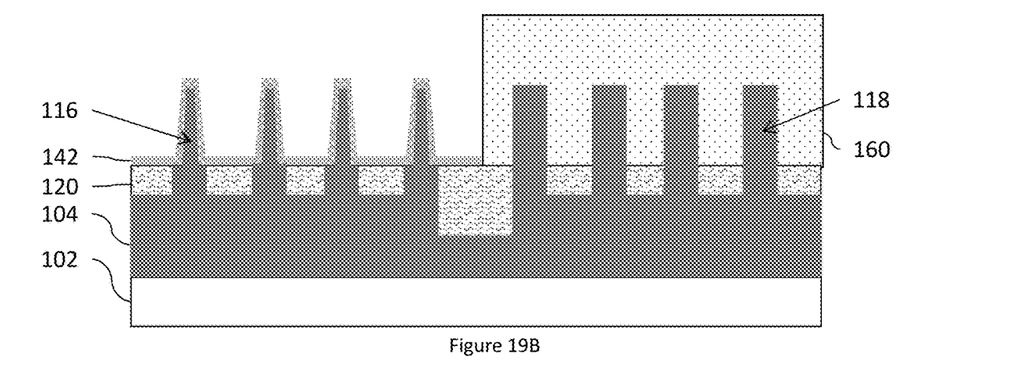
Figure 19C:
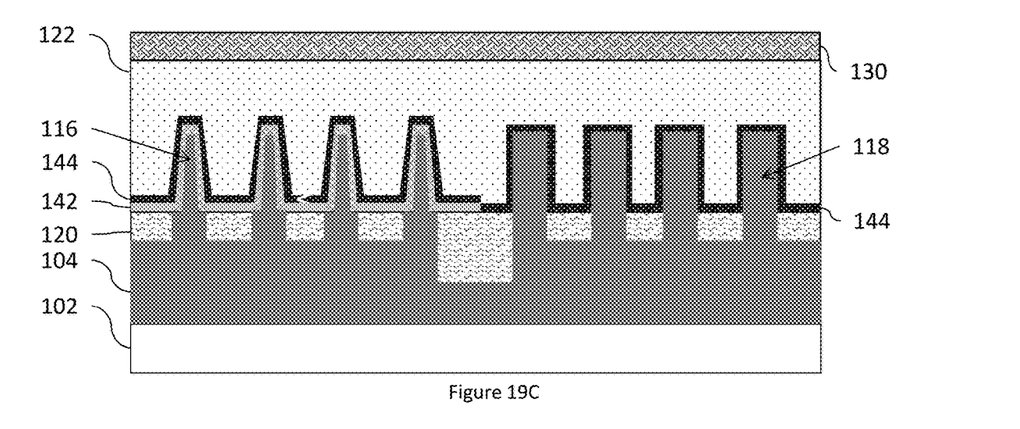

FIGS. 19A-19C illustrate alternative processing. Specifically, in FIG. 19A, before the dummy gate 122 is formed, a protective layer 160 is patterned to protect the second fins 118 and leave the first fins 116 exposed. Then, as shown in FIG. 19B, the first fins 116 are thinned (by performing the above-described processing of oxidization, and oxide stripping). Also, in FIG. 19B, the processing forms the first insulator layer 142, as described above. As shown in FIG. 19C, this processing then removes the protective layer 160, and the second insulator layer 144, the dummy gate 122, and the protective cap 130 (using the processing discussed above).

Figure 20:
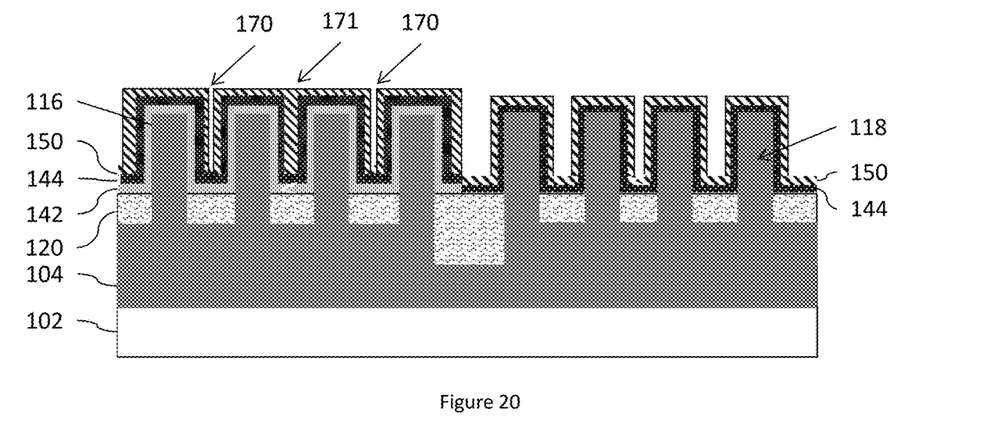

As noted above, often different insulators 142, 144 are used for different types of transistors to allow the transistors to function differently and to achieve specific device performance goals; however, use of multiple insulators 142, 144 can cause the spaces between fins to be too small for effective formation of subsequent structures. For example, as shown in FIG. 20, if the first fins 116 are not thinned using the processing described above, the gaps 170 between the surfaces of the work function metal 150 can be very small, or in some instances there may be no gap 171. The gate conductor 152 and work function metal 150 are designed to be used in combination, and if only the work function metal 150 is present, without the gate conductor 152 (e.g., missing gap 171) the electrical field effects of the gate conductor 152 on the channel regions 116, 118 may detrimentally affect operations of the transistor. In contrast, as shown in FIG. 17, the processing described above produces a uniform thickness work function metal layer 150 that provides gaps between the fins 116, 118, into which the later-formed gate conductor 152 is consistently formed (FIG. 18B).

As shown in FIG. 21, this processing produces a step 174 at the location where the first fin structures 116 intersect the top surface 190 of the isolation layer 120. However, the second fin structures 118 have sidewalls 182, 186 that do not include such a step where the second fin structures 118 intersect the top surface 190 of the isolation layer 120 (at location 184). Note that FIG. 21 shows some fins partially revealed to more clearly illustrate the geometry and contours of the fins, and shows one fin with overlying layers (not partially revealed). The step 174 is a portion of the first fin 116 sidewall that is approximately parallel to (and potentially co-planar with) the top planar surface 190 of the isolation layer 120, and the step 174 is between a lower sidewall portion 172 that is within the isolation layer 120 and an upper sidewall portion 176 that extends from the isolation layer 120. Note that oxidized edges tend to be somewhat rounded, and therefore the step may not form a completely flat surface, and may not be perfectly parallel to the surface of the isolation layer, but instead can be substantially, generally, or approximately parallel to (e.g., within 5%, 10%, 25%, etc., of being parallel to) the surface of the isolation layer.

Note that FIG. 21 illustrates that the respective portions 172, 182 of the fins 116, 118 that remain within the isolation layer 120 both have the same width (W3). However, the portions 176, 186 of the fins 116, 118 that extend from the isolation layer 120 have smaller widths than W3 (fin 116 width W1 is smaller (less wide or narrower) than fin 118 that has width W2). Further, such portions 176, 186 of the fins 116, 118 that extend from the isolation layer 120 may be slightly tapered (narrowed) toward their top or distal ends (the distal ends are furthest away from the top surface 190 of the isolation layer 120) and such tapering can be understood to be occurring with all fin shapes to some extent in such drawings. Therefore, for the first fins 116, the lower sidewall portion 172 is discontinuous with the upper sidewall portion 176 (and is interrupted by the step 174); however, for the second fins 118, the lower sidewall portion 182 is continuous with the upper sidewall portion 186 (because there is not step at location 184). Further, the lower sidewall portion 182 can be approximately (e.g., within 5%, 10%, 25%, etc.) linear with the upper sidewall portion 186.

Thus, the internal width W1 of the first fins 116 between the upper sidewall portions 176 are thinner relative to the internal width W2 of the second fins 118 between the upper sidewall portion 186. This causes the distance D1 between adjacent ones of the first fin structures 116 to be greater than the distance D2 between adjacent ones of the second fin structures 118 (see FIG. 10), leaving more room for thicker and/or multiple insulator(s).

As indicated above, the insulator layer in this example can be made up of two portions, a first portion (142 and 144) on the first fin structures 116 and a second portion (only 144) on the second fin structures 118. In other words, the first portion of the insulator layer comprises at least two layers of potentially different insulating materials (e.g., 142 and 144, and possibly other layers) while the second portion of the insulator layer comprises relatively less layers of insulating materials (e.g., only 144 and possibly other layers) relative to the first portion of the insulator layer. For example, the first portion of the insulator layer can be made of two different insulator layers (e.g., an oxide 142 and a high-k material 144), but the second portion of the insulator layer may only be made of one insulator layer (e.g., only a high-k material layer 144). Therefore, the first portion of the insulator layer (142 and 144) is thicker than the second portion of the insulator layer (only 144). However, because the portions of the first fins 116 that extend from the isolation layer 120 are thinner (W1) relative to the portions of the second fins that extend from the isolation layer 120 (W2) and the distance D1 between the first fins 116 is greater than the distance D2 between the second fins D2, the additional thickness of the first portion of the insulator layer (142 and 144) does not result in inter-fin spacing problems, such as problems with the work function metal layer 150 not having any gap 171, as shown in FIG. 20.

For purposes herein, a "semiconductor" is a material or structure that may include an implanted or in situ (e.g., epitaxially grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

Generally, transistor structures are formed by depositing or implanting impurities into a substrate to form at least one semiconductor channel region, bordered by shallow trench isolation regions below the top (upper) surface of the substrate. A "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped. The "shallow trench isolation" (STI) structures are generally formed by patterning openings/trenches within the substrate and growing or filling the openings with a highly insulating material (this allows different active areas of the substrate to be electrically isolated from one another).

A hardmask can be formed of any suitable material, whether now known or developed in the future, such as a nitride, metal, or organic hardmask, that has a hardness greater than the substrate and insulator materials used in the remainder of the structure.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The flowchart and block diagrams in the figures illustrate the architecture, functionality, and operation of possible implementations of devices and methods according to various embodiments. In this regard, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. An integrated circuit device comprising:
    a first fin-type field effect transistor (finFET) and a second finFET laterally adjacent one another extending from a surface of an isolation layer, wherein the first finFET has a first fin structure and the second finFET has a second fin structure;
    an insulator layer on the first fin structure and the second fin structure;
    a gate conductor intersecting the first fin structure and the second fin structure, wherein at least the insulator layer separates the gate conductor from the first fin structure and the second fin structure; and
    source and drain structures on the first fin structure and the second fin structure laterally adjacent the gate conductor,
    wherein the first fin structure has sidewalls that include a step and the second fin structure has sidewalls that do not include the step, and
    wherein the step is approximately parallel to the surface of the isolation layer.

2. The integrated circuit device in claim 1, wherein a portion of the first fin structure extending from the isolation layer is thinner relative to a portion of the second fin structure extending from the isolation layer.

3. The integrated circuit device in claim 1, further comprising:
    a plurality of the first fin structure comprising first fin structures; and
    a plurality of the second fin structure comprising second fin structures,
    where a first distance between adjacent ones of the first fin structures is greater than a second distance between adjacent ones of the second fin structures.

4. The integrated circuit device in claim 1, wherein the insulator layer comprises a first portion on the first fin structure and a second portion on the second fin structure, and wherein the first portion of the insulator layer is thicker than the second portion of the insulator layer.

5. The integrated circuit device in claim 1, wherein the insulator layer comprises a first portion on the first fin structure and a second portion on the second fin structure,
    wherein the first portion of the insulator layer comprises at least two layers of different insulating materials, and
    wherein the second portion of the insulator layer comprises relatively less layers of insulating materials relative to the first portion of the insulator layer.

6. The integrated circuit device in claim 5, wherein the at least two layers of different insulating materials comprise an oxide layer and a high-k insulator layer, and wherein the relatively less layers comprises only the high-k insulator layer.

7. An integrated circuit device comprising:
    a first fin-type field effect transistor (finFET) and a second finFET laterally adjacent one another extending from a surface of an isolation layer, wherein the first finFET has a first fin structure and the second finFET has a second fin structure;
    an insulator layer on the first fin structure and the second fin structure;
    a gate conductor intersecting the first fin structure and the second fin structure, wherein at least the insulator layer separates the gate conductor from the first fin structure and the second fin structure;
    a work function metal layer between the gate conductor and the insulator layer; and
    source and drain structures on the first fin structure and the second fin structure laterally adjacent the gate conductor,
    wherein the first fin structure has sidewalls that include a step and the second fin structure has sidewalls that do not include the step, and
    wherein the step is approximately parallel to the surface of the isolation layer.

8. An integrated circuit device comprising:

a substrate;

an isolation layer on the substrate, wherein the isolation layer has a surface opposite where the isolation layer contacts the substrate, and wherein the isolation layer has a first area separated from a second area;

first fin-type field effect transistors (finFETs) in the first area of the isolation layer, wherein the first finFETs have first fin structures extending from the substrate through the isolation layer and extending external to the isolation layer;

second finFETs in the second area of the isolation layer, wherein the second finFETs have second fin structures extending from the substrate through the isolation layer and extending external to the isolation layer;

an insulator layer on the first fin structures and the second fin structures, wherein the insulator layer comprises a first portion on the first fin structures and a second portion on the second fin structures, and wherein the first portion of the insulator layer is thicker than the second portion of the insulator layer;

a gate conductor intersecting the first fin structures and the second fin structures, wherein at least the insulator layer separates the gate conductor from the first fin structures and the second fin structures; and source and drain structures on the first fin structures and the second fin structures laterally adjacent the gate conductor, wherein the first fin structures have sidewalls that include a step at a location where the first fin structures intersect the surface of the isolation layer, wherein the second fin structures have sidewalls that do not include the step, and wherein the step is approximately parallel to the surface of the isolation layer.

9. The integrated circuit device in claim 8, wherein a portion of the first fin structures extending from the isolation layer are thinner relative to a portion of the second fin structures extending from the isolation layer.

10. The integrated circuit device in claim 8, where a first distance between adjacent ones of the first fin structures is greater than a second distance between adjacent ones of the second fin structures.

11. The integrated circuit device in claim 8, wherein the first portion of the insulator layer comprises at least two layers of different insulating materials, and wherein the second portion of the insulator layer comprises relatively less layers of insulating materials relative to the first portion of the insulator layer.

12. The integrated circuit device in claim 11, wherein the at least two layers of different insulating materials comprise an oxide layer and a high-k insulator layer, and wherein the relatively less layers comprises only the high-k insulator layer.

13. The integrated circuit device in claim 8, further comprising a work function metal layer between the gate conductor and the insulator layer.

* * * * *